United States Patent
Sullivan et al.

(10) Patent No.: US 11,821,075 B2
(45) Date of Patent: Nov. 21, 2023

(54) ANTI-MICROBIAL COATING PHYSICAL VAPOR DEPOSITION SUCH AS CATHODIC ARC EVAPORATION

(71) Applicant: VAPOR TECHNOLOGIES, INC., Longmont, CO (US)

(72) Inventors: Patrick Anthony Sullivan, Longmont, CO (US); Bryce Randolph Anton, Longmont, CO (US)

(73) Assignee: Vapor Technologies, Inc., Longmont, CO (US)

( * ) Notice: Subject to any disclaimer, the term of this patent is extended or adjusted under 35 U.S.C. 154(b) by 50 days.

(21) Appl. No.: 17/342,887

(22) Filed: Jun. 9, 2021

(65) Prior Publication Data

US 2021/0388484 A1  Dec. 16, 2021

Related U.S. Application Data

(60) Provisional application No. 63/039,015, filed on Jun. 15, 2020.

(51) Int. Cl.
| | |
|---|---|
| *C23C 14/00* | (2006.01) |
| *C23C 14/32* | (2006.01) |
| *C23C 14/06* | (2006.01) |
| *C23C 14/08* | (2006.01) |
| *A01N 59/20* | (2006.01) |
| *A01P 1/00* | (2006.01) |
| *C23C 14/02* | (2006.01) |

(52) U.S. Cl.
CPC ............ *C23C 14/325* (2013.01); *A01N 59/20* (2013.01); *A01P 1/00* (2021.08); *C23C 14/025* (2013.01); *C23C 14/0641* (2013.01); *C23C 14/083* (2013.01); *C23C 14/087* (2013.01)

(58) Field of Classification Search
None
See application file for complete search history.

(56) References Cited

U.S. PATENT DOCUMENTS

| | | |
|---|---|---|
| 5,454,886 A | 10/1995 | Burrell et al. |
| 5,681,575 A | 10/1997 | Burrell et al. |
| 5,753,251 A | 5/1998 | Burrell et al. |
| 5,770,255 A | 6/1998 | Burrell et al. |
| 5,958,440 A | 9/1999 | Burrell et al. |

(Continued)

FOREIGN PATENT DOCUMENTS

| | | |
|---|---|---|
| CN | 108690952 A | 10/2018 |
| CN | 109576651 A | 4/2019 |

(Continued)

OTHER PUBLICATIONS

Machine translation of JP-4370732, translation generated Feb. 2023, 7 pages. (Year: 2023).*

(Continued)

*Primary Examiner* — Robert S Loewe
(74) *Attorney, Agent, or Firm* — Brooks Kushman P.C.

(57) ABSTRACT

A bioactive coated substrate includes a base substrate, an outermost bioactive layer disposed over the base substrate, and a topcoat layer disposed on the outermost bioactive layer. Characteristically, the topcoat layer defines a plurality of pinholes that expose the outermost bioactive layer. A method for forming the bioactive coated substrate is also provided.

40 Claims, 5 Drawing Sheets

(56) References Cited

U.S. PATENT DOCUMENTS

| | | |
|---|---|---|
| 6,238,686 B1 | 5/2001 | Burrell et al. |
| 8,066,854 B2 | 11/2011 | Storey et al. |
| 8,530,056 B2 | 9/2013 | Pilloy et al. |
| 9,107,981 B2 | 8/2015 | Neumann et al. |
| 2003/0104669 A1* | 6/2003 | Eppich ............ H01L 21/02164 257/E21.241 |
| 2007/0213431 A1* | 9/2007 | Adur .................... C08F 255/00 524/588 |
| 2008/0292812 A1* | 11/2008 | Ramm ................ H01J 37/3255 204/298.41 |
| 2009/0162695 A1 | 6/2009 | Hevesi et al. |
| 2009/0198343 A1 | 8/2009 | Spain et al. |
| 2010/0255338 A1* | 10/2010 | Hayakawa .......... C23C 14/0664 156/150 |
| 2012/0034487 A1* | 2/2012 | Chang .................... C23C 14/34 204/192.16 |
| 2012/0077009 A1* | 3/2012 | Chang .................... C23C 14/35 204/192.15 |
| 2013/0108960 A1* | 5/2013 | Hatakeyama ......... G03F 7/0395 430/296 |
| 2014/0037926 A1* | 2/2014 | Chang .................. C23C 28/042 428/220 |
| 2018/0059475 A1* | 3/2018 | Lee ........................ B29D 11/00 |
| 2018/0105927 A1* | 4/2018 | Mak .................... C23C 14/3464 |
| 2018/0105982 A1 | 4/2018 | Mak et al. |
| 2020/0000096 A1* | 1/2020 | Anton .................... A01N 59/16 |
| 2020/0087529 A1* | 3/2020 | Higashikawa ....... C09D 11/101 |

FOREIGN PATENT DOCUMENTS

| | | | |
|---|---|---|---|
| CN | 210310532 U | 4/2020 | |
| JP | 4370732 B2 * | 11/2009 | ............... B05D 3/10 |
| WO | 2013/135364 A2 | 9/2013 | |

OTHER PUBLICATIONS

Serin et al. "The effect of humidity on electronic conductivity of an Au/CuO/Cu2O/Cu sandwich structure." Semiconductor science and technology 15.2 (2000): 112. (Year: 2000).*

Extended Search Report dated Apr. 5, 2022 for EP Appn. No. 21179155.3, 15 pgs.

Zheng, Y.S. et al., "Polymer residue chemical composition analysis and its effect on via contact resisteance in dual damascene copper interconnects process integration," Microelectronics Journal, v. 34, n. 2, (2003), pp. 109-113.

Partial Search Report dated Nov. 15, 2021 for EP Appn. No. 21179155.3, 15 pgs.

* cited by examiner

Table 1. Properties of a bioactive coated substrate and a copper and stainless steel substrate.

| Bioactive Layer | | | Topcoat Layer | | | Cuprotesmo* | | JIS 2801** | |
|---|---|---|---|---|---|---|---|---|---|
| Substrate | Material | Process | Date | Material | Process | Date | white, yellow, pink | Cu ions (yes/no) | Sample (LOG counts) | Control (LOG counts) |
| Stainless steel | CuxO | Cathodic Arc | 3/19/20 | Zr | Cathodic Arc | 3/22/20 | yellow-pink | yes | 2.2 | -- |
| Copper penny | | | | Control (no coating) | | | pink | yes | -- | -- |
| Stainless steel | | | | Control (no coating) | | | white | no | -- | 6.6 |

*Cuprotesmo is a test for presence of Cu ions, Cu(i) and Cu(II), which are thought to play a key role in destroying microbes. However, this is notatest for antimicrobial efficacy. Note that the Cuprotesmo paper reacts with copper by changing color from pale yellow to pink or crimson.
** JIS 2801 is a standard antimicrobial test, contact surface time is 24 hrs, T = 35°C, active organism is E. Coli, referenced to control, units CFU/ml

Fig. 5

ANTI-MICROBIAL COATING PHYSICAL VAPOR DEPOSITION SUCH AS CATHODIC ARC EVAPORATION

CROSS-REFERENCE TO RELATED APPLICATIONS

This application claims the benefit of U.S. provisional application Ser. No. 63/039,015 filed Jun. 15, 2020, the disclosure of which is hereby incorporated in its entirety by reference herein.

TECHNICAL FIELD

In at least one aspect, the present invention relates to a coating system with bioactive properties that is formed by physical vapor deposition and related methods.

BACKGROUND

Physical vapor deposition (PVD) is a technique for thin film formation or coating a substrate. PVD involves vaporization of a material that then condenses on a surface, forming a coating layer. PVD can result in the deposit of macroparticles, which are often considered a defect. The macroparticles may be loosely bound to the coated layer. Mechanical processes can be used to remove these macroparticles, but removal leaves pinholes, which are also often considered defects. For example, cathodic arc evaporation (CAE), a form of PVD, involving a high current, low voltage arc on the surface of a cathodic target produces macroparticles. Because macroparticles and pinholes are recognized as defects, great effort to eliminate or reduce the size and quantity of macroparticles is afforded.

Coatings with bioactive properties can be useful for various purposes. Bioactive refers to a material having biological effects or physiological effects on living things. For example, a bioactive material includes a material resulting in a modification in the normal biological function or a physiological mechanism of a living thing. Bioactive, as used herein, includes beneficial and detrimental effects to microorganisms or modifications to the normal functioning of a microorganism. One common bioactive material is antimicrobial substances. Antimicrobial coatings serve many purposes. Generally, antimicrobial coatings inhibit the growth or kill microbes like viral, bacterial or fungal organisms. One particularly relevant example includes preventing the spread of communicable diseases by the use of antimicrobial materials. Antimicrobial materials may also serve hygienic purposes. The desire to prevent the spread of disease and for heightened hygiene has resulted in significant efforts to develop antimicrobial materials. The use of antimicrobial materials in health care facilities and health treatments can provide significant benefits. Health facilities, such as hospitals, present unique environments that combine high concentrations of germs and individuals with vulnerable immunities. Therefore, facilities such as hospitals greatly benefit from antimicrobial surfaces. Antimicrobial materials for medical equipment can reduce the burden of disinfecting and prevent the spread of disease. Further, affordable antimicrobial surfaces could present benefits on any surface that comes into contact with living things. For example, surfaces involved in cooking or commonly touched surfaces like doorknobs could greatly benefit from antimicrobial properties. Even primarily decorative surfaces, if affordable, could benefit from antimicrobial characteristics and assist in inhibiting the spread and growth of harmful or undesirable antimicrobial life.

But producing antimicrobial materials can be difficult and expensive. Further, antimicrobial properties may have other undesirable properties. For example, some antimicrobial materials may be too soft. Other antimicrobial materials may have poor abrasion resistance. Microban® is an antimicrobial coating that includes silver particles dispersed in an organic matrix. Antimicrobial coatings involving an organic matrix may have the aesthetic appearance of paint. In some applications, the appearance of paint may be undesirable. Some antimicrobial coatings may use nanoparticle vapor deposition to deposit nanoparticles with antimicrobial properties on the surface of a coating. For example, ABACO® from Protec, is an antimicrobial coating using nanoparticles. However, the use of nanoparticles can be complex and expensive. Further such coatings may have delicate surfaces or poor abrasion resistance. Another example of antimicrobial materials includes various metals. For example, silver is known to have antimicrobial properties. However, as stated above silver can be expensive, and its properties may not be suitable for many applications. For example, the appearance or abrasion resistance of silver may be unsuitable for certain applications.

Accordingly, there is a need for an antimicrobial coating that solves one or more of these problems or offers an alternative to current antimicrobial materials.

SUMMARY

In at least one aspect, a bioactive coated substrate is provided. The bioactive coated substrate includes a base substrate, a first bioactive layer disposed over the base substrate, and a topcoat layer disposed on the outermost bioactive layer. Characteristically, the topcoat layer defines a plurality of pinholes that expose the outermost bioactive layer.

In another aspect, a method of forming the bioactive coated substrate set forth herein is provided. The method includes steps of providing a base substrate and then depositing an outermost bioactive layer over the substrate. The outermost bioactive layer has a plurality of macroparticles extending from a surface of the outermost bioactive layer. Otherwise, macroparticles extending from the surface are applied to the outermost bioactive layer. A topcoat layer is deposited on the outermost bioactive layer. Characteristically, the plurality macroparticles extend into the topcoat layer. At least a portion of the plurality macroparticles is removed to form a plurality of pinholes in the topcoat layer down to the outermost bioactive layer.

In still another aspect, a bioactive coated substrate is provided. The bioactive coated substrate includes a base substrate, an outermost bioactive layer disposed on the base substrate, and an indicator layer disposed below the outermost bioactive layer.

BRIEF DESCRIPTION OF THE DRAWINGS

FIG. 5 provides Table 1 which shows properties of a bioactive coated substrates and a copper penny.

DETAILED DESCRIPTION

Figure 1A:
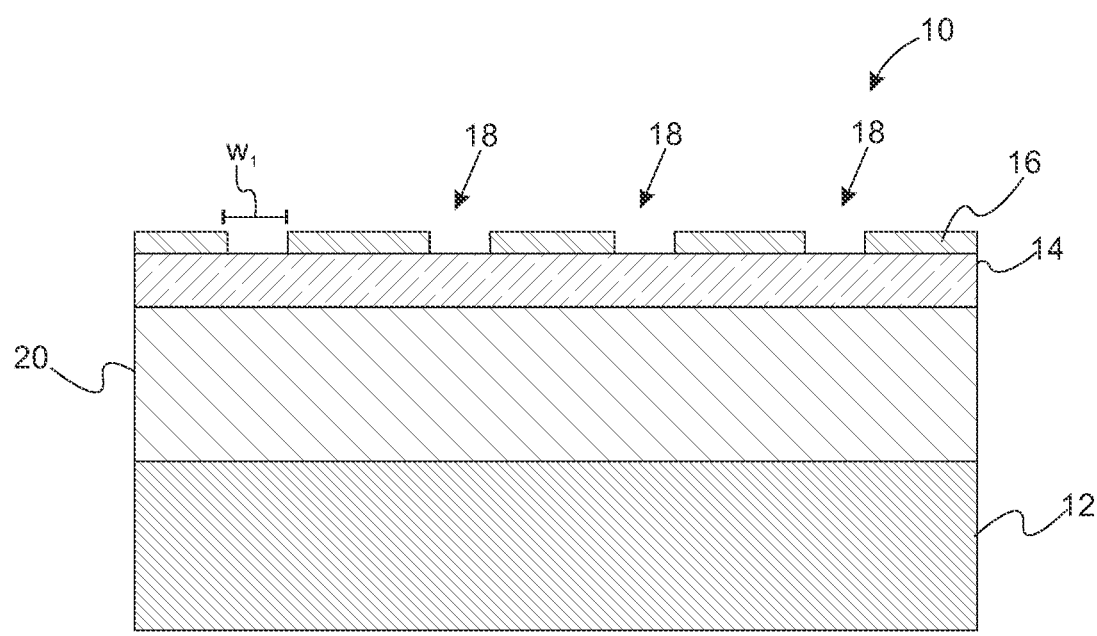
FIG. 1A is a cross-sectional view of a bioactive coated substrate having a plurality of pinholes in the topcoat layer.

Reference will now be made in detail to presently preferred compositions, embodiments and methods of the present invention, which constitute the best modes of practicing the invention presently known to the inventors. The Figures are not necessarily to scale. However, it is to be understood that the disclosed embodiments are merely exemplary of the invention that may be embodied in various and alternative forms. Therefore, specific details disclosed herein are not to be interpreted as limiting, but merely as a representative basis for any aspect of the invention and/or as a representative basis for teaching one skilled in the art to variously employ the present invention.

Except in the examples, or where otherwise expressly indicated, all numerical quantities in this description indicating amounts of material or conditions of reaction and/or use are to be understood as modified by the word "about" in describing the broadest scope of the invention. Practice within the numerical limits stated is generally preferred. Also, unless expressly stated to the contrary: percent, "parts of," and ratio values are by weight; the description of a group or class of materials as suitable or preferred for a given purpose in connection with the invention implies that mixtures of any two or more of the members of the group or class are equally suitable or preferred; description of constituents in chemical terms refers to the constituents at the time of addition to any combination specified in the description, and does not necessarily preclude chemical interactions among the constituents of a mixture once mixed; the first definition of an acronym or other abbreviation applies to all subsequent uses herein of the same abbreviation and applies mutatis mutandis to normal grammatical variations of the initially defined abbreviation; and, unless expressly stated to the contrary, measurement of a property is determined by the same technique as previously or later referenced for the same property.

It must also be noted that, as used in the specification and the appended claims, the singular form "a," "an," and "the" comprise plural referents unless the context clearly indicates otherwise. For example, reference to a component in the singular is intended to comprise a plurality of components.

The phrase "composed of" means "including" or "comprising." Typically, this phrase is used to denote that an object is formed from a material.

The term "comprising" is synonymous with "including," "having," "containing," or "characterized by." These terms are inclusive and open-ended and do not exclude additional, unrecited elements or method steps.

The phrase "consisting of" excludes any element, step, or ingredient not specified in the claim. When this phrase appears in a clause of the body of a claim, rather than immediately following the preamble, it limits only the element set forth in that clause; other elements are not excluded from the claim as a whole.

The phrase "consisting essentially of" limits the scope of a claim to the specified materials or steps, plus those that do not materially affect the basic and novel characteristic(s) of the claimed subject matter.

With respect to the terms "comprising," "consisting of," and "consisting essentially of," where one of these three terms is used herein, the presently disclosed and claimed subject matter can include the use of either of the other two terms.

The term "substantially," "generally," or "about" may be used herein to describe disclosed or claimed embodiments. The term "substantially" may modify a value or relative characteristic disclosed or claimed in the present disclosure. In such instances, "substantially" may signify that the value or relative characteristic it modifies is within ±0%, 0.1%, 0.5%, 1%, 2%, 3%, 4%, 5% or 10% of the value or relative characteristic.

It should also be appreciated that integer ranges explicitly include all intervening integers. For example, the integer range 1-10 explicitly includes 1, 2, 3, 4, 5, 6, 7, 8, 9, and 10. Similarly, the range 1 to 100 includes 1, 2, 3, 4 . . . 97, 98, 99, 100. Similarly, when any range is called for, intervening numbers that are increments of the difference between the upper limit and the lower limit divided by 10 can be taken as alternative upper or lower limits. For example, if the range is 1.1. to 2.1 the following numbers 1.2, 1.3, 1.4, 1.5, 1.6, 1.7, 1.8, 1.9, and 2.0 can be selected as lower or upper limits. In the specific examples set forth herein, concentrations, temperature, and reaction conditions (e.g. pressure, flow rates, etc.) can be practiced with plus or minus 50 percent of the values indicated rounded to three significant figures. In a refinement, concentrations, temperature, and reaction conditions (e.g., pressure, flow rates, etc.) can be practiced with plus or minus 30 percent of the values indicated rounded to three significant figures of the value provided in the examples. In another refinement, concentrations, temperature, and reaction conditions (e.g., flow rates, etc.) can be practiced with plus or minus 10 percent of the values indicated rounded to three significant figures of the value provided in the examples.

In the examples set forth herein, concentrations, temperature, and reaction conditions (e.g., pressure, flow rates, etc.) can be practiced with plus or minus 50 percent of the values indicated rounded to or truncated to two significant figures of the value provided in the examples. In a refinement, concentrations, temperature, and reaction conditions (e.g., pressure, flow rates, etc.) can be practiced with plus or minus 30 percent of the values indicated rounded to or truncated to two significant figures of the value provided in the examples. In another refinement, concentrations, temperature, and reaction conditions (e.g., pressure, flow rates, etc.) can be practiced with plus or minus 10 percent of the values indicated rounded to or truncated to two significant figures of the value provided in the examples.

For all compounds expressed as an empirical chemical formula with a plurality of letters and numeric subscripts (e.g., $CH_2O$), values of the subscripts can be plus or minus 50 percent of the values indicated rounded to or truncated to two significant figures. For example, if $CH_2O$ is indicated, a compound of formula $C_{(0.8-1.2)}H_{(1.6-2.4)}O_{(0.8-1.2)}$. In a refinement, values of the subscripts can be plus or minus 30 percent of the values indicated rounded to or truncated to two significant figures. In still another refinement, values of the subscripts can be plus or minus 20 percent of the values indicated rounded to or truncated to two significant figures.

Throughout this application, where publications are referenced, the disclosures of these publications in their entireties are hereby incorporated by reference into this application to more fully describe the state of the art to which this invention pertains.

Abbreviations:

"CAE" means cathodic arc evaporation.

"PVD" means physical vapor deposition.

Referring to FIG. 1A, a schematic cross-section of a substrate coated with a bioactive material is provided. Bioactive coated substrate 10 includes a base substrate 12 and outermost bioactive layer 14 disposed over and optionally contacting the substrate. The term "base substrate" refers to the substrate before is coated to form the bioactive substrate set forth below. Moreover, the term "outermost bioactive layer" refers to the bioactive layer furthest from the base substrate. In a refinement, outermost bioactive layer 14 has a thickness from about 50 to 1500 nm. Bioactive coated substrate 10 also includes a topcoat layer 16 disposed over and optionally contacting the topcoat layer. In a refinement, topcoat layer 16 has a thickness from about 50 to 1500 nm. Characteristically, topcoat layer 16 defines a plurality of pinholes 18 (e.g., pores) that expose outermost bioactive layer 14 to ambient. Typically, the pinholes have an average width $w_1$ of about 100 nm to 10 microns. In this context, "width" means a distance between walls extending from the bioactive layer that defines each pinhole. In a further refinement, the topcoat layer 16 defines at least about 1 pinhole per square millimeter. Typically, the plurality of pinholes 18 are formed from a plurality of macroparticles formed on a surface of the outermost bioactive layer 14 during deposition of that layer. The macroparticles extend into the topcoat layer and are subsequently removed as described below in more detail to form the pinholes. In a refinement, base layer 20 is interposed between substrate 12 and outermost bioactive layer 14. Base layer 20 optionally contacts substrate 12 and outermost bioactive layer 14 on opposite faces. In a refinement, the base layer is either zirconium carbonitride, zirconium nitride, zirconium oxycarbide, zirconium oxynitride or zirconium oxycarbonitride. Base layer 20 when present typically has a thickness from about 20 to 300 nm. It should be appreciated that the present embodiment is not limited by the particular deposition methods for depositing outermost bioactive layer 14 and topcoat layer 16. For example, these layers can be made by CVD, PVD which could be sputtering or CAE.

Outermost bioactive layer 14 and topcoat layer 16 can be applied to any suitable substrate 12. A suitable substrate 12 can be composed of any material that exhibits thermal stability at an operational (i.e., the temperature that the bioactive coated substrate is used at) or deposition temperatures for each of the layers. In particular, the substrate 12 should be thermally stable at a temperature of at least 80° C. In a refinement, the substrate 12 should be thermally stable at a temperature of at least 250° C. In some refinements, a suitable substrate 12 can be composed of any material that is electrically conductive. For example, suitable materials that the base substrate can be composed of include, but are not limited to, metals, metal alloys and/or carbon materials. Additional examples of suitable materials that the base substrate can be composed of include, but are not limited to, stainless steel, chromium-nickel plated brass, chromium-nickel-copper plated zinc, chromium-nickel-copper plated ABS plastic, and chromium-nickel-copper plated aluminum.

Figure 1B:
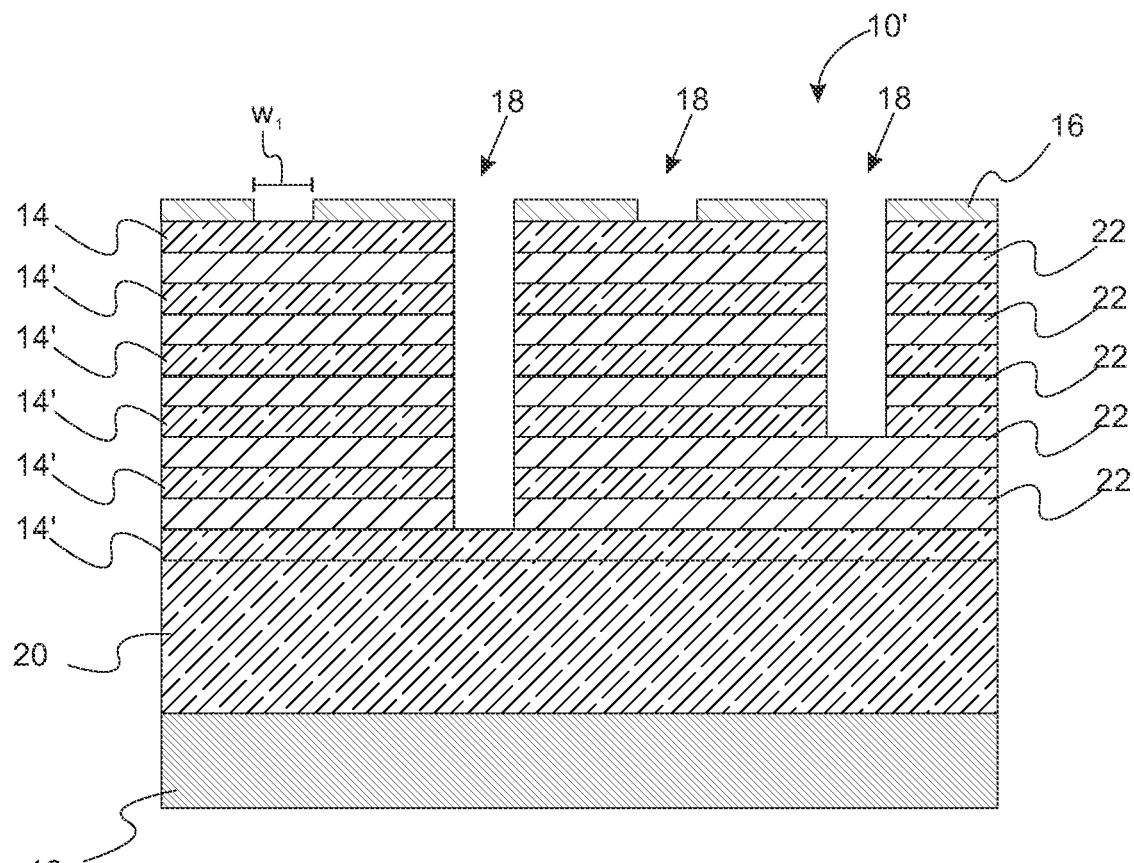
FIG. 1B is a cross-sectional view of a bioactive coated substrate having multiple bioactive layers a plurality of pinholes in the topcoat layer

FIG. 1B provides a schematic cross-section of a bioactive coated substrate 10' having a plurality of alternating additional bioactive layers 14' and interlayers 22 disposed interposed between base layer 20 and outermost bioactive layer 14. Topcoat layer 16 is disposed over outermost bioactive layer 14. Typically, there can be 1 to 10 additional bioactive layers 14' and 1 to 10 interlayers 22. It should be appreciated that pinholes 18 can extend to outermost bioactive layer 14 and/or to any of the additional bioactive layers 14'. In a refinement, the interlayers can be composed of zirconium carbonitride, zirconium nitride, zirconium oxycarbide, zirconium oxynitride or zirconium oxycarbonitride. In another refinement, the interlayers 22 can also be bioactive layers but with a different thickness and/or stoichiometry than the bioactive layers it contacts on opposite faces. In this regard, interlayers 22 can be composed of various copper alloys, as set forth below. In another refinement, the interlayers 22 can be composed of a metal nitride. For example, interlayers 22 can be composed of zirconium nitride (ZrN), titanium nitride (TiN), zirconium oxycarbides (ZrOC), zirconium oxides ($ZrO_2$), diamond-like-carbon (DLC) or a combination thereof.

In another variation, base layer 20 and interlayers 22 are independently composed of zirconium or titanium, carbon, and nitrogen where zirconium is present in an amount of at least 50 mole percent with each of the carbon and nitrogen present in an amount of at least 0.02 and 0.1 mole percent, respectively. In a refinement, base layer 20 and interlayers 22 are independently composed of a compound having the following formula:

$$M_{1-x-y}C_xN_y$$

where M is zirconium or titanium and x is 0.0 to 0.3 and Y is 0.1 to 0.5. In a refinement, x is 0.0 to 0.2 and y is 0.2 to 0.3. In another refinement, x is at least in increasing order of preference 0.0, 0.02, 0.03, 0.04, 0.05, 0.07, or 0.09 and at most in increasing order of preference, 0.5, 0.4, 0.3, 0.25, 0.2, 0.15, or 0.11. Similarly, in this refinement, y is at least in increasing order of preference 0.1, 0.15, 0.2, 0.25, 0.27, or 0.29 and at most in increasing order of preference, 0.6, 0.5, 0.40, 0.35, 0.33, or 0.31. In a further refinement, the base layer is composed of zirconium carbonitride described by $Zr_{0.60}C_{0.10}N_{0.30}$.

In still another variation, base layer 20 and interlayers 22 are independently composed of zirconium or titanium, carbon, and oxygen where zirconium is present in an amount of at least 50 mole percent with each of the carbon and oxygen present in an amount of at least 0.02 and 0.1 mole percent, respectively. In a refinement, base layer 20 and interlayers 22 independently are independently composed of a compound having the following formula:

$$M_{1-x-y}O_xC_y$$

where M is zirconium or titanium and x is 0.1 to 0.4 and y is 0.5 to 0.2. In a further refinement, the base layer is composed of zirconium oxycarbide described by $Zr_{0.50}O_{0.35}C_{0.15}$.

Bioactive layers 14 and 14' can be any material with bioactive properties. In particular, the bioactive layers 14 and 14' are antimicrobial layers. Therefore, the bioactive layers 14 and 14' can include a material with antimicrobial properties. In a refinement, the bioactive layers 14 and 14' can be composed of a metal or metal-containing compound with antimicrobial properties. For example, bioactive layer 14 can be composed of a metal, a metal oxide, a metal alloy or any combination thereof. In another refinement, bioactive layers 14 and 14' can be composed of a component selected from the group consisting of include copper alloys, or copper-containing compounds. Such copper-containing compounds include copper atoms in the +1 or +2 oxidation state or combinations of copper atoms thereof. Examples of copper-containing compounds include, but are limited to copper, copper oxides, copper nitrides, copper oxides containing carbon atoms, and combinations thereof. In one variation, copper alloys include copper and nickel. Typically, each copper alloy includes nickel in an amount from about 8 to 28 weight percent of the total weight of the bioactive layer with the copper being present in an amount from about 72 to 92 weight percent of the total weight of the bioactive layer. In a refinement, the copper alloy includes nickel in an amount from about 10 to 25 weight percent of the total weight of the bioactive layer and copper in an amount form about 75 to 90 weight percent of the total weight of the bioactive layer. In some variations, the copper alloy can independently include additional elements such as iron, zirconium, tungsten, chromium, and combinations thereof. In a refinement, each of these additional elements is independently present in an amount from about 0.01 to about 5 weight percent of the total weight of the bioactive layer. In a refinement, each of these additional elements are independently present in an amount from about 0.01 to about 5 weight percent of the total weight of the bioactive layer. Examples of copper alloys are CuVerro® White Bronze and CuVerro® Rose commercially available from Olin Brass located in Louisville, Ky.

In other variations, the bioactive layers 14 and 14' include silver, a silver alloy, a silver-containing compound (e.g., a silver oxide), or any combination thereof. Other metals that can exhibit antimicrobial properties include but are not limited to gallium (Ga), gold (Au), magnesium (Mg), titanium (Ti), and zinc (Zn). The bioactive layers 14 and 14' can include a combination of metals, metal oxides or metal alloys. This includes, for example, a bioactive layer 14 that includes copper (Cu) and silver (Ag).

In one refinement, each of the one or more of the bioactive layers 14 and 14' are independently composed of $CuO_x$, where x is from 0.1 to 1.0. In another refinement, each of the one or more of the bioactive layers 14 and 14' independently composed of $CuO_aN_b$, where a is from 0.0 to 1.2 and b, is from 0.01 to 0.4. In still another refinement, each of the one or more of the bioactive layers 14 and 14' independently composed of $CuO_cC_d$, where c is from 0.0 to 1.2 and d, is from 0.01 to 0.4. In a variation, each of the one or more of the bioactive layers 14 and 14' independently composed of any combination of copper metal, $CuO_x$, $CuO_aN_b$, and $CuO_cC_d$; Therefore, each of the one or more of the bioactive layers 14 and 14' independently composed of a combination of copper metal, $CuO_x$, $CuO_aN_b$, and $CuO_cC_d$ or a combination of copper metal and $CuO_x$ or a combination of copper metal and $CuO_aN_b$; a mixture of copper metal and $CuO_cC_d$ or a combination of copper metal, $CuO_x$, and $CuO_aN_b$ or a combination of copper metal, $CuO_x$ and $CuO_cC_d$ or a combination of copper metal, $CuO_aN_b$, and $CuO_cC_d$ or a combination of $CuO_x$, $CuO_aN_b$, and $CuO_cC_d$ or a combination of $CuO_x$ and $CuO_aN_b$ or a combination of $CuO_aN_b$, and $CuO_cC_d$ or a combination of $CuO_x$, $CuO_aN_b$, and $CuO_cC_d$. Some suitable bioactive layers can be composed of $Cu_xO_y$, $Cu_xN_y$, $Cu_xO_yN_z$, and $Cu_xO_yC_z$ where x can be 1, 2, or 3; y can be 1, 2, or 3; and z can be 1, 2, or 3.

Advantageously, topcoat layer 16 provides a number of useful properties to the bioactive coated substrate. For example, the topcoat layer 16 can provide improved abrasion resistance. In particular, the topcoat layer 16 can provide a higher abrasion resistance than outermost bioactive layer 14. A topcoat layer 16 with higher abrasion resistance can reduce wear to the surface of outermost bioactive layer 14. In another refinement, bioactive coated substrate 10 includes an antimicrobial layer and a topcoat layer 16 with a higher abrasion resistance can be suitable for a surgical tool or instrument. The abrasion resistance can be determined by ISO 28080. The topcoat layer 16 is not limited to providing abrasion resistance. For example, the topcoat layer 16 can provide improved hardness, impact resistance and/or toughness. In another example, the topcoat layer 16 can provide an appealing or desired aesthetic effect. For example, the topcoat layer can be chromium. Topcoat layer 16 can also impart improved hardness to the bioactive coated substrate. The topcoat layer 16 can be applied by any suitable deposition technique such as PVD and CAE. In a refinement, topcoat layer 106 can be composed of carbides, gold, graphite, nitrides, platinum, titanium, or titanium nitride, Zr, ZrN, ZrCN, ZrON, $ZrO_2$, ZrOC, Cr, CrN, CrCN, Ti, TiN, TiCN, TiON, $TiO_2$, and TiOC.

In a variation, the layer immediately below the outermost bioactive layer 14 can be used as an indicator layer that the outermost bioactive layer 14 has worn away. Such an indicator layer can serve as a visual indication that the outermost bioactive layer 14 is compromised. For example, the indicator can have a distinctly different color from the bioactive layer 14 and thus serve to visually alert a user that outermost bioactive layer 14 is compromised. With respect to setting the color of the various layers so that color differences can be determined, it should be appreciated that the color of each of the layers set forth above can independently be changed by adjusting the thicknesses and or stoichiometries of the layer. In a refinement, the indicator layer can be another metal, alloy or metal-containing compound with a distinctly different color. Advantageously, the bioactive coated substrate is such that the color of the top most (from the substrate) bioactive antimicrobial layer has a visually perceivable color that is different from the color of the layer immediately below it.

With respect to the bioactive coated substrates 10 and 10' of FIGS. 1A and 1B, there are two scenarios by which the wear can be visually detected. In the first scenario, wearing away of both topcoat 16 and outermost bioactive layer 14 is visually perceived because of the different colors of top layer 14 and the layer immediately below the top layer. In the second scenario, topcoat layer 16 and outermost bioactive layer 14 can be of a sufficiently different color such that wearing away of topcoat layer 16 is visually perceived.

Figure 2A:
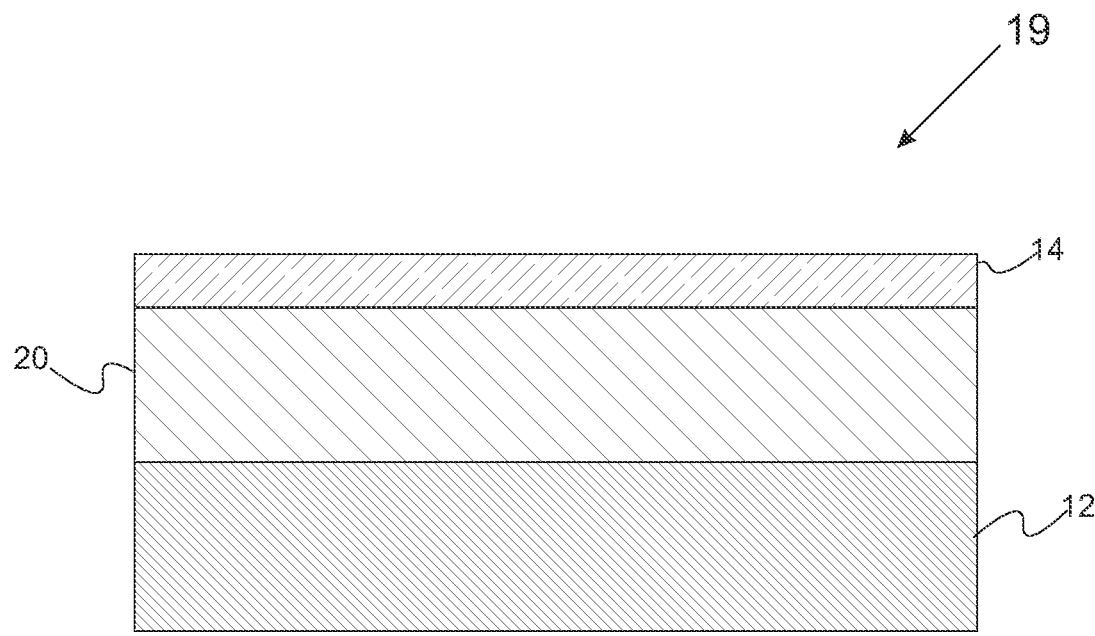
FIG. 2A is a side view of a cross-section of a bioactive coated substrate substantially pinhole-free and with a single bioactive layer and an indicator layer.
Figure 2B:
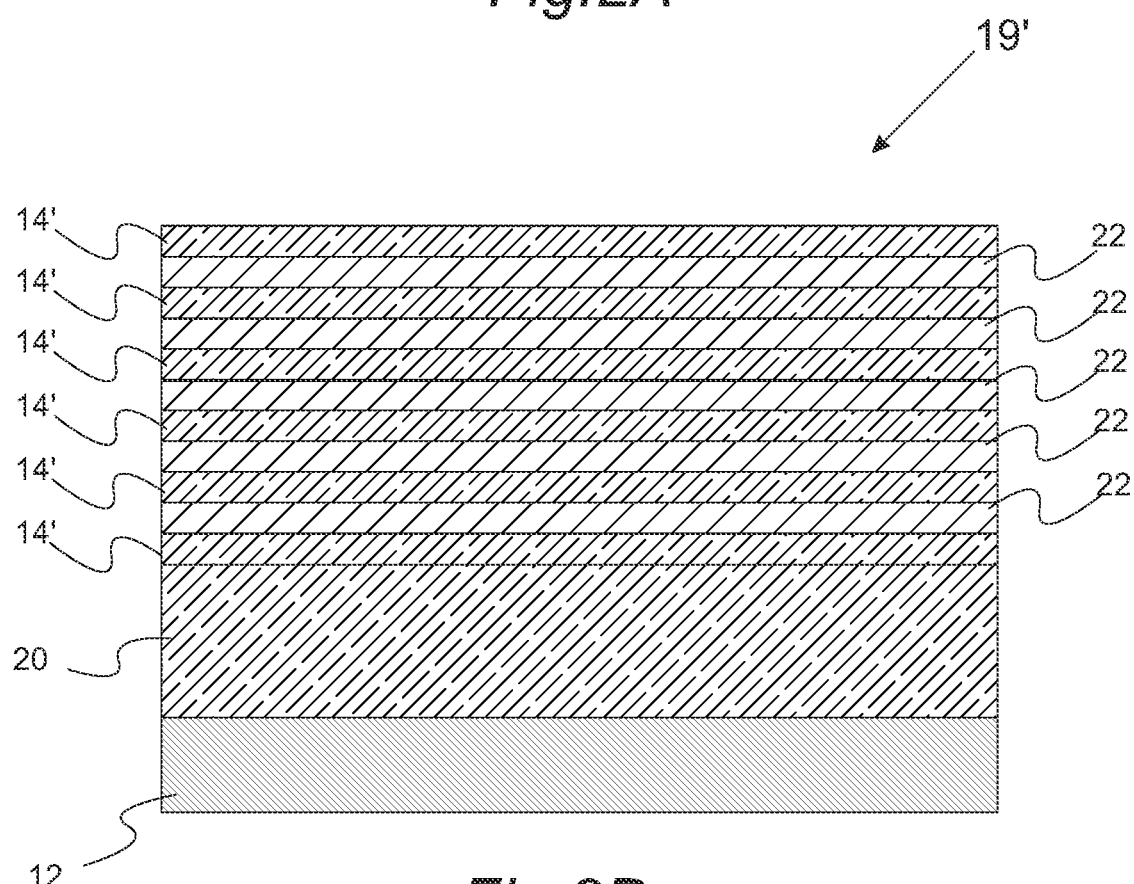
FIG. 2B is a side view of a cross-section of a bioactive coated substrate substantially pinhole-free and with multiple bioactive layers and an indicator layer

FIGS. 2A and 2B show an embodiment that does not include a topcoat layer. In these figures, base substrate 12, bioactive layer 14, optional base layer 20, additional bioactive layers 14' and interlayers 22 are the same as set forth above. In particular, the construction of bioactive coated substrate 19 of FIG. 2A is the same as the construction of the bioactive coated substrate 10 of FIG. 1A but for the topcoat layer. Similarly, the construction of bioactive coated substrate 19' of FIG. 2B is the same as the construction of the bioactive coated substrate 10' of FIG. 1A but for the topcoat layer.

In accessing color differences, it should be appreciated that the outermost bioactive layer 14 and the layer immediately below the outermost bioactive layer (as well as the substrate and other layers) can be characterized by Lab color space coordinates L*, a*, and b* relative to CIE standard illuminant D50. In a refinement, at least one of Lab color space coordinates L*, a*, and b* relative to CIE standard illuminant D50 of the outermost bioactive layer differs from that of the layer immediately below the outermost bioactive layer by at least in increasing order of preference, 5%, 10%, 15%, 20%, 25% or 50%. In another refinement, each of the Lab color space coordinates L*, a*, and b* relative to CIE standard illuminant D50 of the outermost bioactive layer differ from those of the layer immediately below the outermost bioactive layer by at least in increasing order of preference, 5%, 10%, 15%, 20%, 25% or 50%. In a variation, Delta E (2000), which quantifies the distance between two points in the color space, can be used to quantify the difference between two colors. A visual or noticeable distinction between two colors can be impacted by various factors, including the viewer, the texture, and gloss. In a refinement, a delta E greater than or equal to 0.5 is a sufficient difference in color for the indicator. In another refinement, a delta E greater than or equal to 1.0 is a sufficient difference in color. In still another refinement, a delta E greater than or equal to 2.0 is a sufficient difference.

Figure 3A:
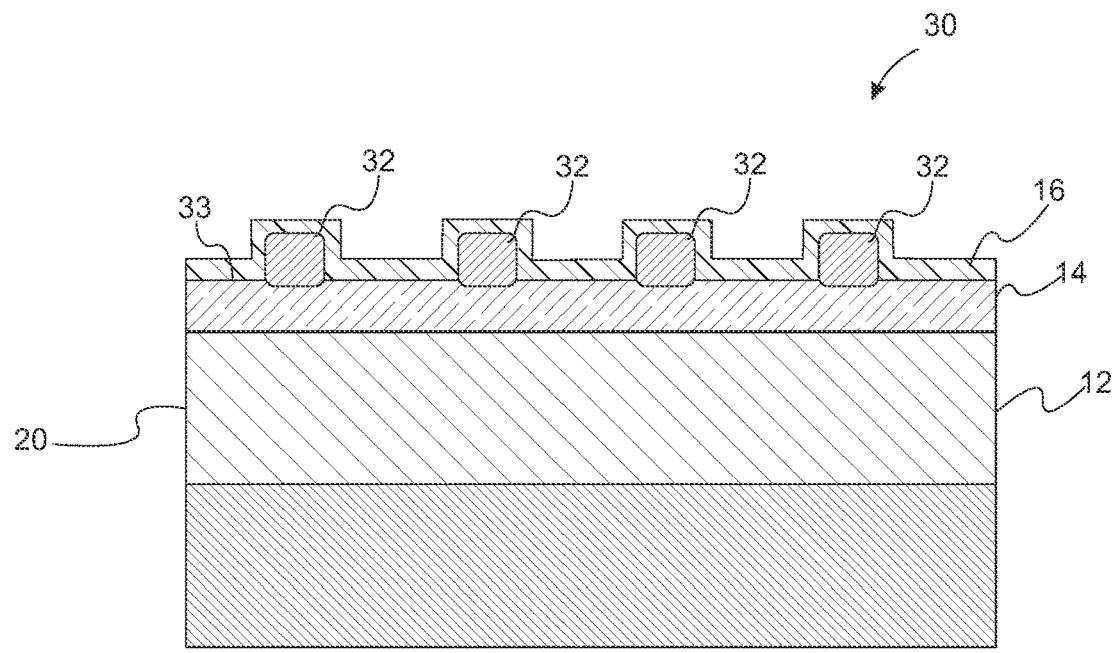
FIG. 3A is a cross-sectional view of a precursor coated substrate having a single bioactive layer with a plurality of macroparticles and a topcoat layer.
Figure 3B:
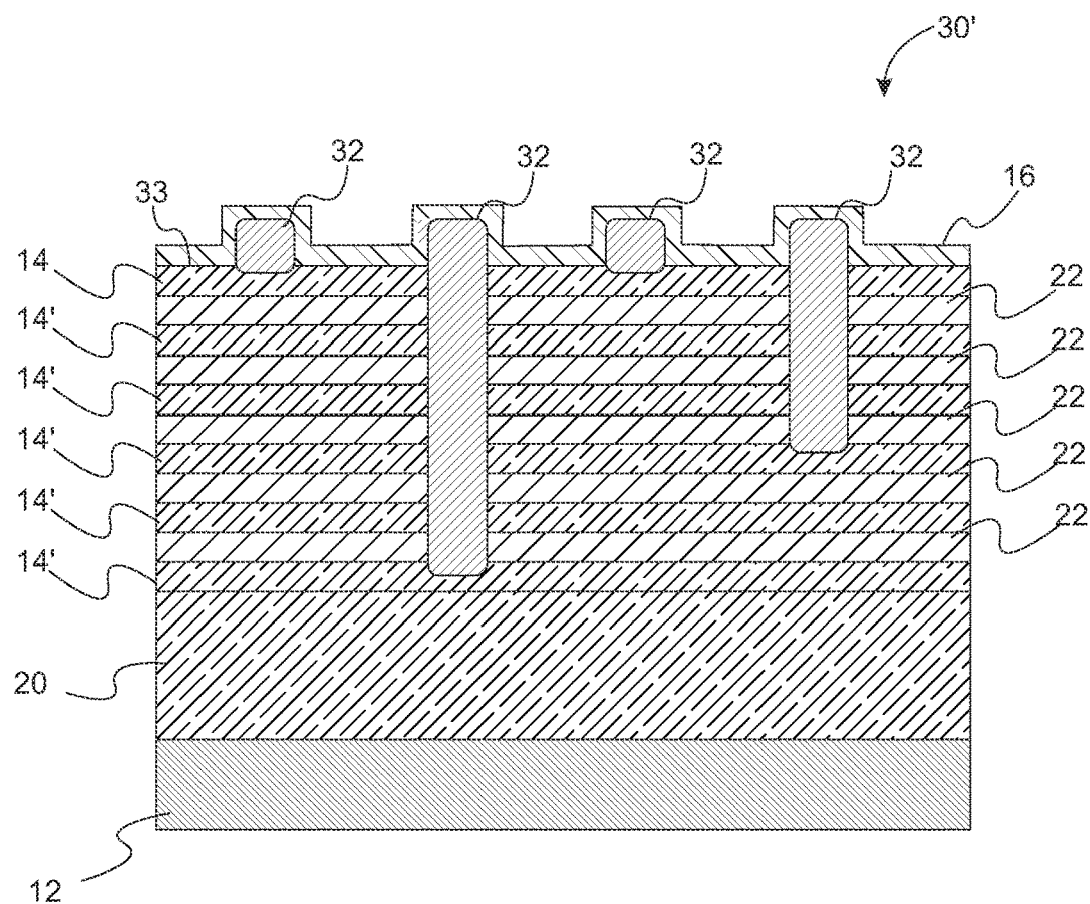
FIG. 3B is a cross-sectional view of a precursor coated substrate having multiple bioactive layers with an outermost bioactive layer having a plurality of macroparticles.

Referring to FIGS. 3A and 3B, schematic cross-sections of a substrate coated with a bioactive material having macroparticles that extend into the topcoat layer is provided. As set forth above, this coating system of FIG. 2A can be used to form bioactive coated substrate 10 of FIG. 1A, while the precursor substrate 10 can be used to form bioactive coated substrate 10 of FIG. 1B. With reference to FIG. 3A, precursor coated substrate 30 includes base substrate 12, outermost bioactive layer 14 disposed over the substrate, a topcoat layer 16 disposed over the bioactive layer. A plurality of macroparticles 32 extend from surface 33 of outermost bioactive layer 14 into topcoat layer 16. Similarly, FIG. 3B shows that precursor coated substrate 30' includes a base substrate 12, an optional base layer 20 disposed over the substrate, outermost bioactive layer 14 disposed over the substrate and base layer if present, a topcoat layer 16 disposed over the outermost bioactive layer, and a plurality of alternating additional bioactive layers 14' and interlayers 22 interposed between base layer 20 and outermost bioactive layer 14. Topcoat layer 16 is disposed over outermost bioactive layer with the plurality of macroparticles extending into or embedded therein. It should be appreciated that the macroparticles 108 can extend to the outermost bioactive layer 14 and/or to additional bioactive layers 14'. In a refinement, the plurality of macroparticles have an average diameter $d_2$ of about 50 nm to 0.1 microns. The plurality of macroparticles 108 can be loosely bound to bioactive layers 14 and to topcoat layer 16 such that the plurality of macroparticles 108 can be mechanically removed from the topcoat layer 16. For example, the plurality of macroparticles 22 can be removed by wiping the surface of the topcoat layer 106 with a dry cloth. Therefore, removing the plurality of macroparticles 22 yields a plurality of pinholes.

In another embodiments, the bioactive coated substrate is included in an article. In a refinement, the useful article further includes an indicator layer as set forth above. Many healthcare or hospital surfaces may greatly benefit from a bioactive coated substrate. For example, useful articles can include but are not limited to bedrails, footboards, bed-side tables, knobs, handles, safety rails, carts, push plates, kick plates, mop plates, stretcher plates, spigots, drains, sinks, faucets, drain levers, water fountain components, sanitizers/soap dispensers, hand dryers, commonly used buttons, headrest, showerheads, countertops, hinges, locks, latches, trim, toilet or urinal hardware, light switches, armrest, thermostat controls, telephones, floor tiles, ceiling tiles, wall tiles, instrument handles (e.g. drug delivery systems, monitoring systems, hospital beds, office equipment, operating room equipment, stands and fixtures), IV poles, trays, pans, walkers, wheelchairs, keyboards, computer mouse surfaces, exercise equipment, rehabilitation equipment, physical therapy equipment, lamps, lighting systems, lids, hangers, remotes, cup holders, toothbrush holders, gown snaps, and window sills. Likewise, popular or common areas in general could benefit from articles with bioactive coated substrate s. For example, some articles or surfaces can include but are not limited to shopping carts, shopping cart handles, child seats, handrails, register keypads, register housings, ATMs, lockers, elevator controls, paper towel dispensers, toilet paper dispensers, vending machines, and restroom surfaces. Similar articles and surfaces can benefit in housing areas, mass transit, laboratories, religious gathering facilities, or any commonly visited facilities. Other uses can include but are not limited to writing utensils, eyeglass frames, combs, phone covers, tablet covers, headphone, and bottle openers to name a few.

Figure 4:
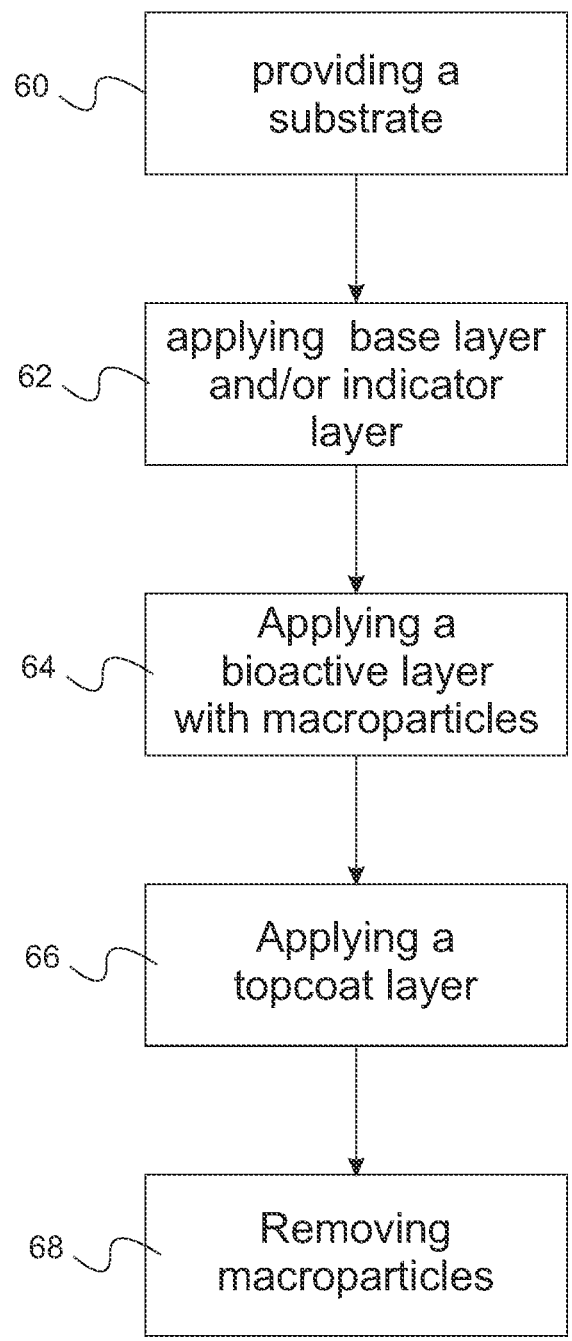
FIG. 4 is a flow chart depicting a method for preparing a bioactive coated substrate.

Referring to FIG. 4, a flow chart depicting a method of forming the bioactive coated substrate set forth above is provided. The method includes step 60 of providing a substrate. The method also includes step 62, which includes applying an optional base layer and/or an optional indicator layer. The base layer and/or the indicator layer can be applied by sputtering or by CAE. At step 64, the method includes a step of applying an outermost bioactive layer over the base substrate and/or the optional base layer and/or an optional indicator layer if present. The outermost bioactive active layer can be applied by PVD in a manner that results in the deposit of a plurality of macroparticles. Advantageously, the bioactive layer can be applied by CAE. In a refinement, the method can include applying alternating layers including additional bioactive active layers and interlayers as set forth above prior to the deposition of the outmost bioactive layer. It should be appreciated that if additional bioactive layers are present, the macroparticles can extend to the outermost bioactive layer and/or to the additional bioactive layers. Finally, the method includes a step of applying a topcoat layer at step 66. In a refinement, the topcoat layer can be applied by PVD. In a refinement, the topcoat layer can be applied by CAE. The method of applying a bioactive coated substrate can further include step 68 in which the plurality of macroparticles is removed. Typically, the plurality of macroparticles is mechanically removed. For example, the plurality of macroparticles can be removed by wiping with a dry cloth. In a refinement, the plurality of macroparticles can be removed by mass finishing the bioactive coated substrate.

The following examples illustrate the various embodiments of the present invention. Those skilled in the art will recognize many variations that are within the spirit of the present invention and scope of the claims.

A bioactive coated substrate including a stainless steel substrate coated with a copper oxide bioactive layer and a zirconium topcoat layer applied by cathodic arc evaporation had superior antimicrobial performance as compared with control substrates. The bioactive coated substrate had superior performance as compared with a stainless steel control substrate. As provided in Table 1, Cuprotesmo test was used to determine the presence of copper ions (e.g. Cu(I) and Cu(II)). This is not a direct test for bioactive or antimicrobial efficacy but without being bound by theory copper ions are believed to play a role is inhibit and/or destroy microbes. A reactive paper is used to determine the presence of copper ions by changing colors. The color pink indicates the presence of copper ions. Table 1 (FIG. 5) provides properties of the bioactive coated substrate (i.e., a bioactive coated onto a stainless steel substrate) along with a copper substrate (i.e., a penny) and a stainless steel substrate.

The bioactive coated substrate was also tested for its antibacterial activity and efficacy using the standard JIS 2801 method with a contact surface time of 24 hours at 35°

C. with *E. coli*. The test was run in reference to the control and measured in colony-forming units (CFU) per milliliter (mL). As shown by Table 1, the bioactive coated substrate has a lower quantity of colony-forming units by about 4.4 log counts compared with stainless steel, which indicates significant antimicrobial activity.

EXAMPLE 1

Multi-Layer with Copper Nitride

A vacuum thin film deposition chamber is pumped down to a pressure of 5.0e-5 Torr. The chamber is then heated to a temperature of 100 C using wall mounted resistive heating elements. On a carousel inside the chamber, stainless steel door handles are mounted on racks that rotate in a 2-axis planetary motion in between a wall mounted magnetron sputtering cathode and a centrally located cylindrical arc cathode. An ion etch surface preparation is carried out by backfilling with Argon gas to a pressure of 25.0 mTorr and a bias voltage of −500V is applied to parts for 5 minutes. A first Zirconium metal adhesion layer is applied to the handles by striking an arc on the arc cathode at a current of 300 A. The chamber is backfilled by Argon to a pressure of 3.0 mTorr and a substrate bias of −50V is applied. This step lasts 5 minutes to build a layer of 50 nm thick Zr metal. A second coating layer comprised of a Zirconium Nitride, is applied by continuing to run the arc on the Zr target but adding Nitrogen gas at flows of 150 sccm for a composition of approximately $ZrN_{0.50}$. This layer is built up to approximately 10 nm in 1 minute. A third layer is applied by continuing to run the arc on the Zr target and flow the Argon and Nitrogen gases while powering a Copper magnetron sputtering cathode to 9.5 kW. This step lasts for 4 minutes to build a co-deposited mixed metal compound layer. In the third step, the Zirconium arc target is shut off while the Copper magnetron sputtering cathode remains on as does the flow of Argon and Nitrogen. This sputter-only step lasts for 30 minutes to build a $CuN_{0.3}$ coating around 300 nm thick at which point the Cu sputtering cathode and the Nitrogen gas is shut off, leaving only Argon to continue to flow at a pressure of 3.0 mTorr. The shutter to the magnetron sputtering cathode is closed. After this, a fourth step of Zirconium metal adhesion layer is applied to the handles by striking an arc on the arc cathode at a current of 300 A. The chamber is backfilled by Argon to a pressure of 3.0 mTorr and a substrate bias of −50V is applied for 5 minutes to build a layer of 50 nm thick Zr metal. A fifth layer is added comprised of a Zirconium Nitride, which is applied by continuing to run the arc on the Zr target but adding Nitrogen gas at flows of 150 sccm for a composition of approximately $ZrN_{0.50}$. This layer is built up to about 300 nm in 20 minutes. A sixth and final layer is added comprised of a Zirconium Oxide, which is applied by continuing to run the arc on the Zr target but shutting off both the Argon and Nitrogen flow while adding 500 sccm of Oxygen flow while maintaining a pressure of 1 mTorr to achieve a composition of approximately $ZrO_{0.50}$ for 37 seconds to deposit approximately 10 nm.

EXAMPLE 2

Multi-Layer with Copper Oxide

A vacuum thin film deposition chamber is pumped down to a pressure of 5.0e-5 Torr. On a carousel inside the chamber, chrome plated brass faucet spouts are fixtured on a rack that rotates on a single ax is between the chamber wall mounted arc cathode and a centrally located cylindrical arc cathode. An ion etch surface preparation is carried out by backfilling with Argon gas to a pressure of 25.0 mTorr and a bias voltage of −500V is applied to parts for 5 minutes. A Copper Oxide layer is applied to the spouts by striking an arc on a Copper arc wall mounted cathode at a current of 350 A. The chamber is backfilled by Oxygen to a pressure of 2.0 mTorr and a substrate bias of −50V is applied. This step lasts 8 minutes to build a layer of 200 nm thick Copper Oxide for an approximate composition of $CuO_{0.3}$. A second coating layer is applied to the spouts by striking an arc on a Zirconium arc cathode at a current of 460 A. The chamber is backfilled by Argon to a pressure of 3.0 mTorr and a substrate bias of −50V is applied. This step lasts 3 minutes to build a layer of 50 nm thick of zirconium as an adhesion layer. A final layer is added comprised of a zirconium oxycarbide, which is applied by continuing to run the arc on the Zr target but shutting off the Nitrogen flow while adding 200 sccm of Oxygen and 100 sccm of methane flow while maintaining a pressure of 3 mTorr to achieve a composition of approximately $ZrO_{0.35}C_{0.15}$. This final layer is built up to 300 nm in 20 minutes.

While exemplary embodiments are described above, it is not intended that these embodiments describe all possible forms of the invention. Rather, the words used in the specification are words of description rather than limitation, and it is understood that various changes may be made without departing from the spirit and scope of the invention. Additionally, the features of various implementing embodiments may be combined to form further embodiments of the invention.

What is claimed is:

1. A bioactive coated substrate comprising:
   a base substrate;
   an outermost bioactive layer disposed on the base substrate; and
   a topcoat layer disposed on the outermost bioactive layer, the topcoat layer defining a plurality of pinholes that expose the outermost bioactive layer, wherein the outermost bioactive layer has a thickness from about 50 to 1500 nm and the topcoat layer has a thickness from about 50 to 1500 nm.

2. The bioactive coated substrate of claim 1, wherein the plurality of pinholes have an average width of about 100 nm to 10 microns.

3. The bioactive coated substrate of claim 1, wherein the outermost bioactive layer is composed of a component selected from the group consisting of copper metal, copper alloy, copper oxides, copper nitrides, copper oxides containing carbon atoms, and combinations thereof.

4. The bioactive coated substrate of claim 1, wherein the outermost bioactive layer is composed of $CuO_x$, where x is from 0.1 to 1.0.

5. The bioactive coated substrate of claim 1, wherein the outermost bioactive layer is composed of $CuO_aN_b$, where a is from 0.0 to 1.2 and b is from 0.01 to 0.4.

6. The bioactive coated substrate of claim 1, wherein the outermost bioactive layer is composed of $CuO_cC_d$, where c is from 0.0 to 1.2 and d is from 0.01 to 0.4.

7. The bioactive coated substrate of claim 1 further comprising a base layer interposed between the base substrate and the outermost bioactive layer.

8. The bioactive coated substrate of claim 7, wherein the base layer has a thickness from about 20 to 300 nm.

9. The bioactive coated substrate of claim 7 further comprising a plurality of alternating additional bioactive layers and interlayers interposed between base layer and outermost bioactive layer.

10. The bioactive coated substrate of claim 9 wherein pinholes extend to the outermost bioactive layer and/or to one or more of the additional bioactive layers.

11. The bioactive coated substrate of claim 9, wherein the base layer and the interlayers are independently composed of a compound having formula:

$$M_{1-x-y}C_xN_y$$

where M is zirconium or titanium and x is 0.0 to 0.3 and Y is 0.1 to 0.5.

12. The bioactive coated substrate of claim 9, wherein the base layer and the interlayers are independently of a compound having formula:

$$M_{1-x-y}O_xC_y.$$

where M is zirconium or titanium and x is 0.1 to 0.4 and y is 0.5 to 0.2.

13. The bioactive coated substrate of claim 9, wherein the additional bioactive layers are composed of copper metal, copper alloys, or copper-containing compounds, the copper-containing compounds including copper atoms in a +1 or +2 oxidation state or combinations of copper atoms thereof.

14. The bioactive coated substrate of claim 9, wherein the topcoat layer is composed of a component selected from the group consisting of carbides, gold, graphite, nitrides, platinum, titanium, titanium nitride, Zr, ZrN, ZrCN, ZrON, ZrO$_2$, ZrOC, Cr, CrN, CrCN, Ti, TiN, TiCN, TiON, TiO$_2$, and TiOC, and combinations thereof.

15. A bioactive coated substrate comprising:
a base substrate;
an outermost bioactive layer disposed on the base substrate, the outermost bioactive layer being composed of CuO$_a$N$_b$ or CuO$_c$C$_d$, where a is from 0.0 to 1.2, b is from 0.01 to 0.4, c is from 0.0 to 1.2 and d is from 0.01 to 0.4; and
a topcoat layer disposed on the outermost bioactive layer, the topcoat layer defining a plurality of pinholes that expose the outermost bioactive layer.

16. The bioactive coated substrate of claim 15, wherein the plurality of pinholes have an average width of about 100 nm to 10 microns.

17. The bioactive coated substrate of claim 15, wherein the outermost bioactive layer has a thickness from about 50 to 1500 nm and the topcoat layer has a thickness from about 50 to 1500 nm.

18. The bioactive coated substrate of claim 15, wherein the outermost bioactive layer is composed of a component selected from the group consisting of copper metal, copper alloy, copper oxides, copper nitrides, copper oxides containing carbon atoms, and combinations thereof.

19. The bioactive coated substrate of claim 15 further comprising a base layer interposed between the base substrate and the outermost bioactive layer.

20. The bioactive coated substrate of claim 19, wherein the base layer has a thickness from about 20 to 300 nm.

21. The bioactive coated substrate of claim 19 further comprising a plurality of alternating additional bioactive layers and interlayers interposed between base layer and outermost bioactive layer.

22. The bioactive coated substrate of claim 21 comprising 1 to 10 additional bioactive layers 14' and 1 to 10 interlayers 22.

23. The bioactive coated substrate of claim 21 wherein pinholes extend to the outermost bioactive layer and/or to one or more of the additional bioactive layers.

24. The bioactive coated substrate of claim 21, wherein the base layer and the interlayers are independently composed of a compound having formula:

$$M_{1-x-y}C_xN_y$$

where M is zirconium or titanium and x is 0.0 to 0.3 and Y is 0.1 to 0.5.

25. The bioactive coated substrate of claim 21, wherein the base layer and the interlayers are independently of a compound having formula:

$$M_{1-x-y}O_xC_y.$$

where M is zirconium or titanium and x is 0.1 to 0.4 and y is 0.5 to 0.2.

26. The bioactive coated substrate of claim 21, wherein the additional bioactive layers are composed of copper metal, copper alloys, or copper-containing compounds, the copper-containing compounds including copper atoms in a +1 or +2 oxidation state or combinations of copper atoms thereof.

27. The bioactive coated substrate of claim 21, wherein the topcoat layer is composed of a component selected from the group consisting of carbides, gold, graphite, nitrides, platinum, titanium, titanium nitride, Zr, ZrN, ZrCN, ZrON, ZrO$_2$, ZrOC, Cr, CrN, CrCN, Ti, TiN, TiCN, TiON, TiO$_2$, and TiOC, and combinations thereof.

28. A bioactive coated substrate comprising:
a base substrate;
an outermost bioactive layer disposed on the base substrate; and
a topcoat layer disposed on the outermost bioactive layer, the topcoat layer defining a plurality of pinholes that expose the outermost bioactive layer; and
a base layer interposed between the base substrate and the outermost bioactive layer, wherein the base layer has a thickness from about 20 to 300 nm.

29. The bioactive coated substrate of claim 28, wherein the plurality of pinholes have an average width of about 100 nm to 10 microns.

30. The bioactive coated substrate of claim 28, wherein the outermost bioactive layer is composed of a component selected from the group consisting of copper metal, copper alloy, copper oxides, copper nitrides, copper oxides containing carbon atoms, and combinations thereof.

31. The bioactive coated substrate of claim 28, wherein the outermost bioactive layer is composed of CuO$_x$, where x is from 0.1 to 1.0.

32. The bioactive coated substrate of claim 28, wherein the outermost bioactive layer is composed of CuO$_a$N$_b$, where a is from 0.0 to 1.2 and b is from 0.01 to 0.4.

33. The bioactive coated substrate of claim 28, wherein the outermost bioactive layer is composed of CuO$_c$C$_d$, where c is from 0.0 to 1.2 and d is from 0.01 to 0.4.

34. The bioactive coated substrate of claim 28 further comprising a plurality of alternating additional bioactive layers and interlayers interposed between base layer and outermost bioactive layer.

35. The bioactive coated substrate of claim 34 comprising 1 to 10 additional bioactive layers 14' and 1 to 10 interlayers 22.

36. The bioactive coated substrate of claim 34, wherein pinholes extend to the outermost bioactive layer and/or to one or more of the additional bioactive layers.

37. The bioactive coated substrate of claim 34, wherein the base layer and the interlayers are independently composed of a compound having formula:

$$M_{1-x-y}C_xN_y,$$

where M is zirconium or titanium and x is 0.0 to 0.3 and Y is 0.1 to 0.5.

38. The bioactive coated substrate of claim 34, wherein the base layer and the interlayers are independently of a compound having formula:

$$M_{1-x-y}O_xC_y.$$

where M is zirconium or titanium and x is 0.1 to 0.4 and y is 0.5 to 0.2.

39. The bioactive coated substrate of claim 34, wherein the additional bioactive layers are composed of copper metal, copper alloys, or copper-containing compounds, the copper-containing compounds including copper atoms in a +1 or +2 oxidation state or combinations of copper atoms thereof.

40. The bioactive coated substrate of claim 34, wherein the topcoat layer is composed of a component selected from the group consisting of carbides, gold, graphite, nitrides, platinum, titanium, titanium nitride, Zr, ZrN, ZrCN, ZrON, $ZrO_2$, ZrOC, Cr, CrN, CrCN, Ti, TiN, TiCN, TiON, $TiO_2$, and TiOC, and combinations thereof.

* * * * *